(12) United States Patent
Alexander et al.

(10) Patent No.: US 6,845,048 B2
(45) Date of Patent: Jan. 18, 2005

(54) SYSTEM AND METHOD FOR MONITORING INTERNAL VOLTAGES ON AN INTEGRATED CIRCUIT

(75) Inventors: George W. Alexander, Durham, NC (US); Jennifer F. Huckaby, Raleigh, NC (US); Steven M. Baker, Apex, NC (US); David S. Ma, Cary, NC (US)

(73) Assignee: Infineon Technologies AG, Munich (DE)

( * ) Notice: Subject to any disclaimer, the term of this patent is extended or adjusted under 35 U.S.C. 154(b) by 118 days.

(21) Appl. No.: 10/255,767

(22) Filed: Sep. 25, 2002

(65) Prior Publication Data

US 2004/0057289 A1 Mar. 25, 2004

(51) Int. Cl.[7] ............... G11C 11/4074; G11C 11/4193; H03K 17/693
(52) U.S. Cl. ................ 365/189.02; 365/189.09; 365/226; 327/407; 327/99
(58) Field of Search .............. 365/226, 189.09, 365/189.02; 327/407, 99; 341/141

(56) References Cited

U.S. PATENT DOCUMENTS

| | | | | |
|---|---|---|---|---|
| 4,191,856 A | * | 3/1980 | Nagano et al. ............. 370/533 |
| 4,196,358 A | * | 4/1980 | Conover et al. ............. 327/411 |
| 4,961,422 A | * | 10/1990 | Marchosky et al. .......... 607/99 |
| 5,184,162 A | * | 2/1993 | Saitoh et al. ............. 324/158.1 |
| 5,430,400 A | * | 7/1995 | Herlein et al. .............. 327/108 |
| 5,801,571 A | * | 9/1998 | Allen et al. ................. 327/407 |
| 6,339,357 B1 | * | 1/2002 | Yamasaki et al. ........... 327/538 |
| 6,549,480 B2 | * | 4/2003 | Hosogane et al. .......... 365/226 |
| 2002/0036576 A1 | * | 3/2002 | Saito .......................... 341/122 |

* cited by examiner

*Primary Examiner*—Michael S. Lebentritt
*Assistant Examiner*—J. H. Hur
(74) *Attorney, Agent, or Firm*—Brinks Hofer Gilson & Lione

(57) ABSTRACT

A system and method for monitoring internal voltage sources in an integrated circuit, such as a DRAM integrated circuit, includes an internal analog multiplexing circuit, an internal analog-to-digital converter, and an interface circuit. Through the analog multiplexing circuit, the analog-to-digital converter sequentially connects to each voltage source and converts the measured voltage level of the source to a binary word. The interface circuit presents the binary word, e.g., serially, to test equipment off the integrated circuit.

15 Claims, 5 Drawing Sheets

SYSTEM AND METHOD FOR MONITORING INTERNAL VOLTAGES ON AN INTEGRATED CIRCUIT

FIELD OF THE INVENTION

This invention relates to Dynamic Random Access Memory. More particularly, the invention relates to a system and method for monitoring internal voltages on an integrated circuit such as a Dynamic Random Access Memory.

BACKGROUND

Many electronic devices and systems include integrated circuits for the storage of data during the operation of the devices. For example, electronic devices such as computers, printing devices, scanning devices, personal digital assistants, calculators, computer work stations, audio and/or video devices, communications devices such as cellular telephones, and routers for packet switched networks may include memory in the form of integrated circuits for retaining data as part of their operation. Advantages of using integrated circuit memory compared to other forms of memory include space conservation and miniaturization, conserving limited battery resources, decreasing access time to data stored in the memory, and cutting the costs of assembling the electronic devices.

Dynamic Random Access Memory ("DRAM") is an example of integrated circuit memory. DRAM typically comprises an array of semiconductor capacitor cells, each of which may hold an amount of electric charge that represents the logical value of a stored bit. The cells in the array are typically arranged in rows and columns. Each cell is defined by the intersection of a row and a column. Each cell in the DRAM array may be accessed by simultaneously addressing the intersecting row and column.

In operation, internal amplifiers in the DRAM sense the amounts of electric charges stored on the capacitors. Based on the sensed electric charges, the outputs of the sense amplifiers represent the logical values of the bits that are stored in the DRAM array. In this manner, the data stored in the array may be extracted from the DRAM integrated circuit for use by other integrated circuits in the electronic device. In addition, other internal circuitry on the DRAM refreshes the charges on those cells. In this manner, the DRAM compensates for leakages of electric charge from the semiconductor capacitor cells, such as leakage into the substrate of the DRAM integrated circuit. Such reading, writing, and maintaining of charge on the cells are substantial internal operations of the DRAM.

The DRAM integrated circuit also includes internal voltage generators that act as voltage sources for maintaining various parts of the DRAM integrated circuit at chosen voltage levels. The output voltage levels of the voltage generators are chosen to produce optimal performance of the DRAM integrated circuit by minimizing leakage of charge into the substrate of the integrated circuit and not crossing breakdown thresholds for the semiconductor structures in the integrated circuit.

If the internal voltage generators do not operate at their chosen voltage level, the DRAM integrated circuit may not operate efficiently or may fail. As the voltage sources are internal to the DRAM integrated circuit, there is presently no efficient method for monitoring these voltage generators to determine whether the integrated circuit is failing, has failed, or is operating inefficiently.

SUMMARY

Therefore, there is a need for an improved monitoring system for measuring the voltage levels of the voltage generators on the DRAM integrated circuit. There is also a need to efficiently convey the monitoring results from the integrated circuit to test equipment. In order to address deficiencies in the prior art, a system is provided for monitoring internal voltages of an integrated circuit, such as a DRAM integrated circuit. Preferably, the system conveys the monitoring results off the integrated circuit to test equipment using as few pins of the DRAM integrated circuit as possible.

One aspect of the invention is a system for monitoring voltage levels of multiple internal voltage sources on an integrated circuit. The system includes an analog multiplexing circuit integrally formed on the integrated circuit. The analog multiplexing circuit has multiple inputs and an output. Each input of the analog multiplexing circuit is in communication with a respective voltage source. The analog multiplexing circuit also has multiple control lines for enabling a respective input of the analog multiplexing circuit. The system also includes an analog-to-digital converter integrally formed on the integrated circuit. The analog-to-digital converter has an input and at least one output. The input of the analog-to-digital converter is in communication with the output of the analog multiplexing circuit. The system also includes an interface circuit integrally formed on the integrated circuit. The interface circuit has at least one input and at least one output. The inputs of the interface circuit are in communication with the outputs of the analog-to-digital converter. The outputs of the interface circuit provide a digital representation of the voltage levels of the internal voltage sources.

Another aspect is a method for monitoring voltage levels of internal voltage sources on an integrated circuit. The method includes enabling an input of an analog multiplexing circuit integrally formed on the integrated circuit. Each input of the analog multiplexing circuit is in communication with a respective voltage source. The integrated circuit measures a voltage at the enabled input of the analog multiplexing circuit and converts the voltage to a digital representation of the voltage. The integrated circuit outputs the digital representation of the voltage.

The foregoing and other features and advantages of preferred embodiments of the present invention will be more readily apparent from the following detailed description, which proceeds with reference to the accompanying drawings.

DETAILED DESCRIPTION OF THE PRESENTLY PREFERRED EMBODIMENTS

Figure 1:
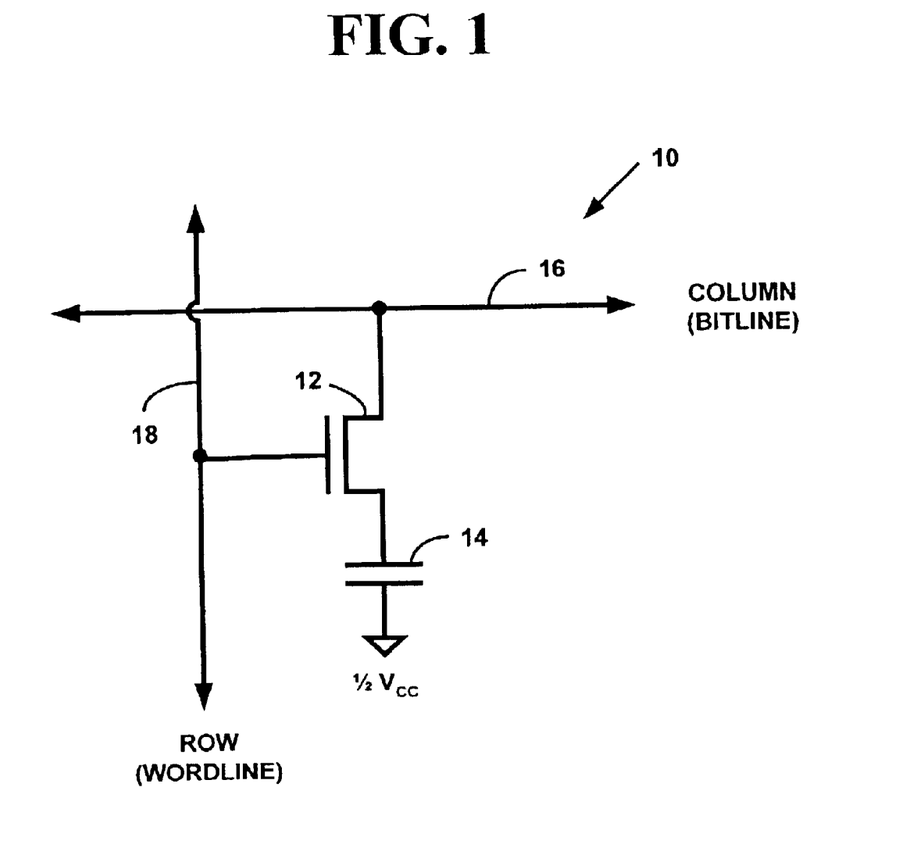
FIG. 1 is a diagram illustrating a preferred configuration of a memory cell in a DRAM array.

FIG. 1 is a diagram illustrating a preferred configuration of a memory cell 10 in a DRAM array. The memory cell 10 in this example includes an N-type metal oxide semiconductor ("MOS") transistor 12 and a capacitor 14. The transistor 12 and capacitor 14 may be formed on a substrate using fabrication techniques known to those of ordinary skill in the DRAM fabrication art. A first end of the MOS transistor 12 conduction path connects to a plate of the capacitor 14. A second end of the MOS transistor 12 conduction path connects to a column conduction path 16 that is common to all cells 10 that are associated in a column. For N-type MOS transistors 12, the end of the conduction path that is at a higher potential relative to the other end is commonly referred to as a "drain" by those of ordinary skill in the art, and the other end of the conduction path is commonly referred to as a "source."

The column conduction path 16 is often termed a "bitline" by those of ordinary skill in the DRAM fabrication art. The gate of the MOS transistor 12 connects to a row conduction path 18 that is common to all cells 10 that are associated in a row. The row conduction path 18 is often termed a "wordline" by those of ordinary skill in the DRAM fabrication art. It should be understood by one of ordinary skill in the art that the orientation of the rows and columns as shown in FIG. 1 are rotated by ninety degrees from the usual meaning of their orientation for the purpose of more fully describing the preferred embodiments to be described below.

The DRAM maintains the other plate of the capacitor 14 at a potential that is half of the potential that represents a logic value of one or a full potential swing. Those of ordinary skill in the art refer to the potential for a logic value of one as $V_{CC}$. Storing a logic value of one in the cell 10 includes raising the bitline 16 to a potential of $V_{CC}$ and raising the wordline 18 to a higher potential, $V_{CCP}$. $V_{CCP}$ is a potential that will enable the transistor 12 to conduct throughout the charging process. The transistor 12 conducts and the upper plate of the capacitor 14 is charged to a potential of $V_{CC}$. Storing a logic value of zero in the cell 10 includes lowering the bitline 16 to a potential of zero and raising the wordline 18 to $V_{CCP}$. The transistor 12 conducts and the upper plate of the capacitor 14 is discharged to zero potential through the transistor 12.

Reading the logic value stored in the cell 10 includes raising the potential on the wordline 18 to $V_{CCP}$. The transistor 12 conducts, transferring charge between the capacitor 14 and the bitline 16. A sense amplifier (not shown) detects a change in potential of the bitline 16, amplifies the change, and provides an output representative of the logic value that was stored in the memory cell 10. In a preferred embodiment of the memory cell 10, the bitline 16 is pre-charged to a potential of $\frac{1}{2}V_{CC}$ before the wordline 18 potential rises to initiate the reading process. If a logic value of one was stored in the cell 10, the potential on the upper plate of the capacitor 14 is expected to be greater than $\frac{1}{2}V_{CC}$, having fallen from $V_{CC}$ due to leakage. In this case, the potential on the bitline 16 will rise slightly from $\frac{1}{2}V_{CC}$. Alternatively, if a logic value of zero was stored in the cell 10, the potential on the upper plate of the capacitor 14 is expected to be less than $\frac{1}{2}V_{CC}$, having risen from zero due to leakage. In this case, the potential on the bitline 16 will fall slightly from $\frac{1}{2}V_{CC}$. The sense amplifier detects the slight rise or fall of potential on the bitline 16 and outputs a potential corresponding to a logic value of one or zero accordingly.

Figure 2:
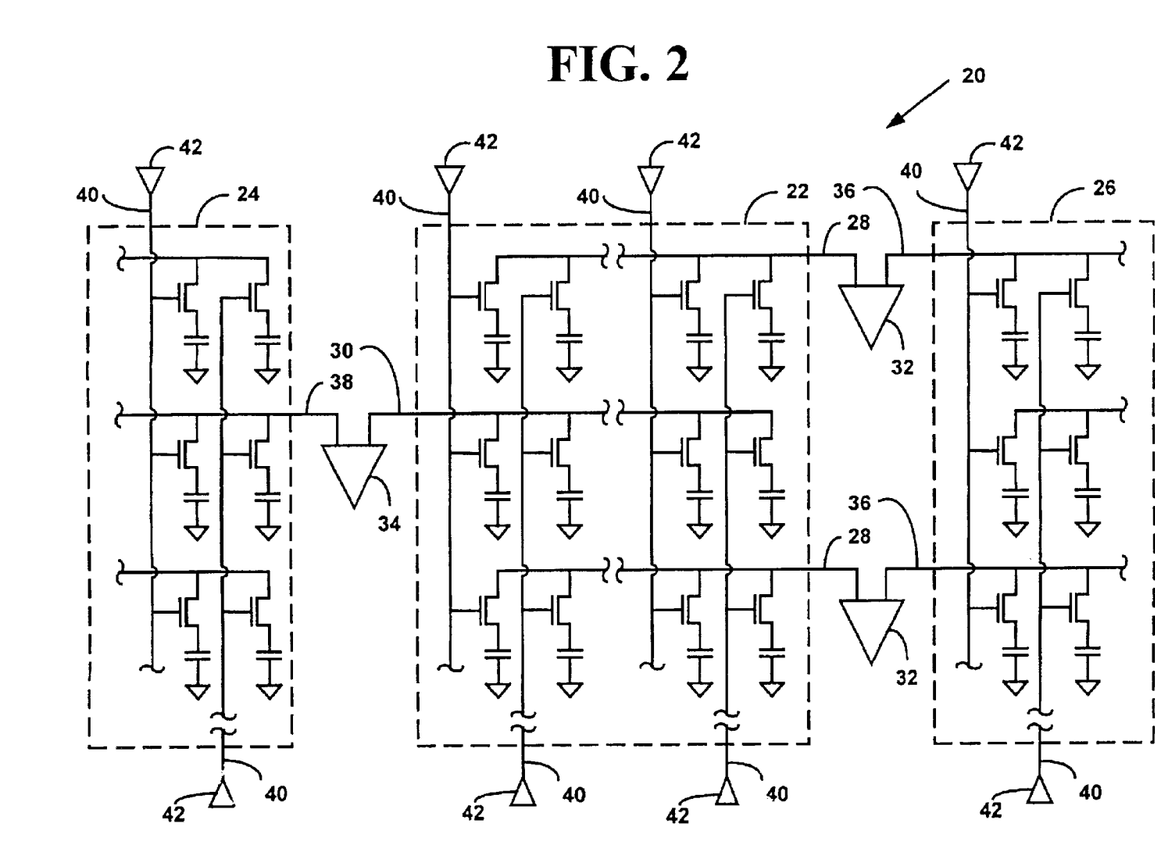
FIG. 2 is a diagram illustrating a preferred configuration of a DRAM array.

FIG. 2 is a diagram illustrating a preferred configuration of a portion of a DRAM array 20. A DRAM array 20 of memory cells 10 may comprise one or more memory sections 22–26. An example of a DRAM array 20 is a sixty-four Megabit ("Mb") array, where one Megabit is $2^{20}$ bits or 1,048,576 bits. As shown in FIG. 2, a memory section 22 may have a left neighboring section 24 and a right neighboring section 26. Sections 22–26 at the edge of the die of the DRAM integrated circuit ordinarily lack a left 24 or right 26 neighboring section.

It should be understood that the DRAM array of the present invention is not restricted to the configuration of memory cells 10 in the DRAM array 20 as depicted in FIG. 2 and that other configurations of the DRAM array are possible. For example, not each crossing of a bitline 16 and a wordline 18 may be connected to a memory cell 10. In another preferred configuration, on a selected bitline 16 each alternate crossing with a wordline 18 is connected to a memory cell 10.

Dividing the DRAM array 20 into memory sections 22–26 provides shorter bitlines and/or wordlines than if the lines ran across the whole DRAM array 20. As is known to those of ordinary skill in the art, long lines may have large resistances or have parasitic capacitances with neighboring lines that reduce the performance of the DRAM array 20. For example, a 64 Mb DRAM array 20 may include sixteen sections 22–26, each comprising 4 Mb of memory. It should be understood, however, that the exemplary memory sizes of 64 Mb and 4 Mb are for illustrative purposes only and that the present invention is not restricted to 64 Mb DRAM arrays having 4 Mb sections and that other array and section sizes are possible.

In a preferred arrangement of bitlines within the section 22, alternate bitlines exit the section 22 in opposing directions. One selection of bitlines exits the section 22 to the right of the section 22. These bitlines are termed "right bitlines" 28 ("RBLs") by those of ordinary skill in the art. Another selection of bitlines exits the section 22 to the left of the section 22. These bitlines are termed "left bitlines" 30 ("LBLs"). Each RBL 28 connects to a sense amplifier 32, termed a "right sense amplifier" 32 by those of ordinary skill in the art. Each LBL 30 connects to a sense amplifier 34, often termed a "left sense amplifier" 34 by those of ordinary skill in the art.

In a preferred embodiment of the DRAM array 20, neighboring memory sections 22–26 share common sense amplifiers 32, 34. For example, RBLs 28 of the section 22 share sense amplifiers 32 with the LBLs 36 of the right neighboring section 26. Also, LBLs 30 of the section 22 share sense amplifiers 34 with the RBLs 38 of the left neighboring section 24. This cuts the number of required sense amplifiers 32, 34 for the DRAM array 20 by a factor of approximately two. If the DRAM array 20 does not fire more than one wordline 40 at a time, the sense amplifiers 32, 34 do not encounter ambiguities regarding from which section 22–26 they are reading.

The DRAM array 20 includes wordline drivers 42, which raise the potential on the gates of the transistors 12 in a row substantially to $V_{CCP}$ for reading, writing, or refreshing the array 20. The DRAM array 20 also includes write drivers (not shown) for raising or lowering the potentials on the bitlines 36 that charge the capacitors 14 of memory cells 10 potentials corresponding to logic values of one or zero.

Voltage Monitoring System

Figure 3:
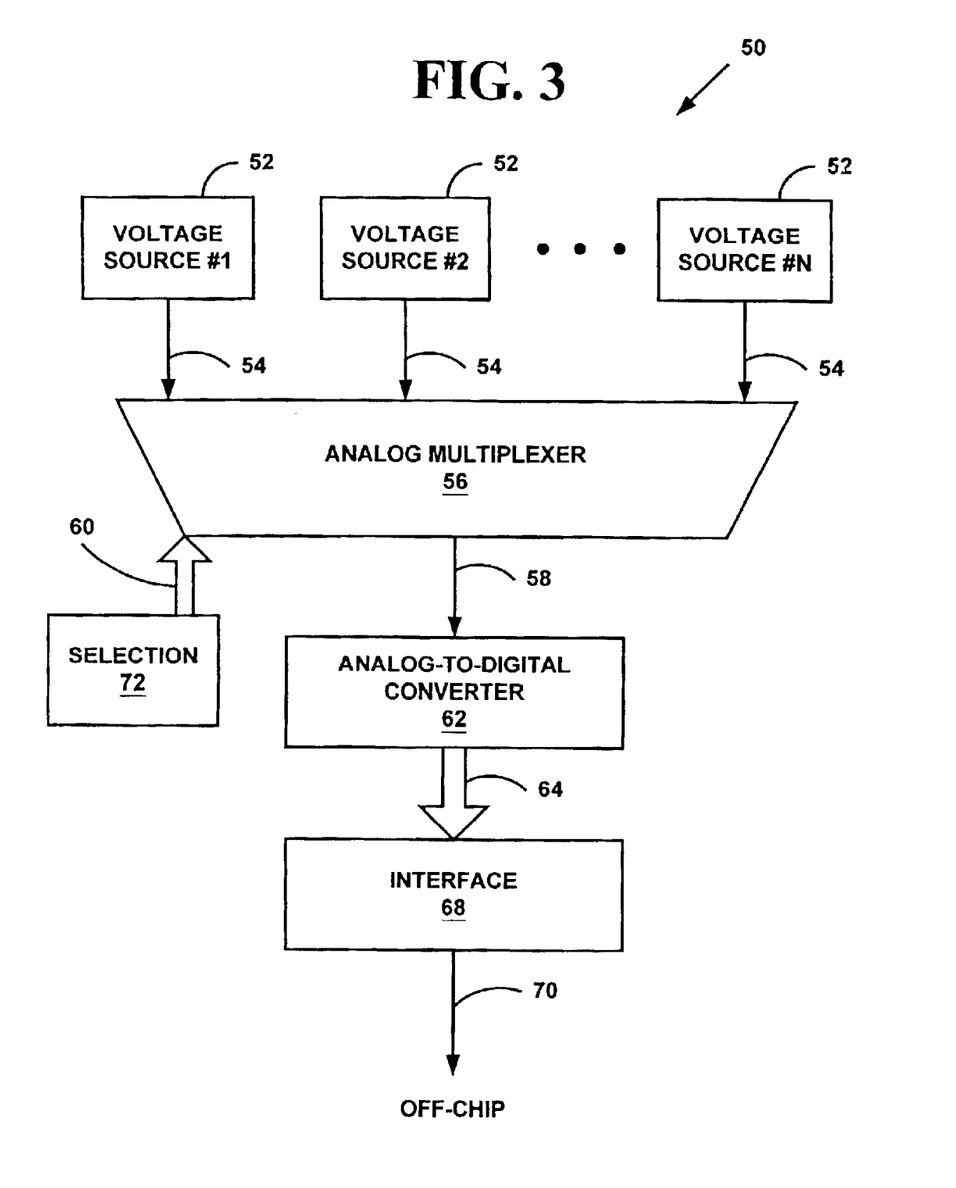
FIG. 3 is a block diagram illustrating a preferred system for monitoring voltage levels of internal voltage sources on an integrated circuit.

FIG. 3 is a block diagram illustrating a preferred system 50 for monitoring voltage levels of internal voltage sources 52 on an integrated circuit. In a preferred embodiment, the integrated circuit is a DRAM integrated circuit comprising the DRAM arrays 20 of FIG. 2. It should be understood, however, that the monitoring system of the present invention is not restricted to DRAM integrated circuits, and that the monitoring system may monitor voltage sources 52 internal to other integrated circuits such as microprocessors, digital signal processors, and analog signal processors.

It should also be understood that the integrated circuit is not restricted to the component blocks of FIG. 3 and that other components and sub-systems may be included in the integrated circuit. The integrated circuit may be fabricated using integrated circuit fabrication techniques familiar to those of ordinary skill in the art, such as silicon or Gallium Arsenide ("GaAs") fabrication techniques.

In a preferred embodiment, the voltage sources 52 are internal voltage generators for the DRAM integrated circuit. The DRAM integrated circuit typically has a selection of internal voltage generators 52 for maintaining various parts of the DRAM integrated circuit at chosen voltage levels. The internal voltage generators 52 are held at particular voltages to produce optimal performance of the DRAM integrated circuit. Voltage generators maybe fabricated according to various technologies. Voltage generators used in DRAM design include voltage regulators such as bandgap voltage references and linear voltage convertors, and voltage/charge pumps.

For example, one internal voltage generator 52 maintains a potential of $V_{CC}$ for powering the internal circuitry of the DRAM arrays 20. Another exemplary internal voltage generator 52 maintains a potential of $V_{CCP}$ for raising the potential on the wordlines 18 to operate the transistors 12 in the memory cells 10 of the DRAM arrays 20. Other exemplary internal voltage generators 52 include: a voltage regulator that maintains a potential of $V_{INT}$, which is a regulated voltage internal to the integrated circuit; another voltage regulator that maintains a potential of $V_{BLH}$, which is a regulated voltage representative of a high potential on a bitline 16; yet another voltage regulator that maintains a potential of $V_{BLEQ}$, which is a regulated voltage for equalizing neighboring bitlines 16 before sensing charges on the memory cells 10; and yet another voltage regulator that maintains a potential of $V_{PL}$, which is the potential on the lower plate of the capacitor 14 of each memory cell 10.

Exemplary internal voltage pumps include: voltage pump that generates a potential of $V_{BB}$, also known as back bias or vertical leakage suppression, which minimizes leakage of charge into the substrate of the integrated circuit; another voltage pump that generates a potential of $V_{PP}$ which is a voltage to which a wordline is driven for proper rewriting to a memory cell 10 during replenishment; and yet another voltage pump that generates a potential of $V_{NWLL}$, which is a low negative voltage to which a word line is driven to reduce leakage current an a memory cell 10 transistor 12. As exemplified above, a typical DRAM integrated circuit may contain multiple voltage sources 52.

The monitoring system 50 includes an analog multiplexing circuit 56 integrally formed on the integrated circuit chip, an analog-to-digital converter 62 integrally formed on the integrated circuit chip, and an interface circuit 68 integrally formed on the integrated circuit chip. Inputs 54 to the analog multiplexing circuit 56 communicate with respective voltage sources 52. Control lines 60 enable one input 54 of the analog multiplexing circuit 56 at a time in order to selectively monitor the voltage source 52 that is associated with the enabled input 54. An output 58 of the analog multiplexing circuit 56 is at a potential that is related to the voltage at the enabled input 54, i.e., the voltage level of the selected voltage source 52. The output 58 of the analog multiplexing circuit 56 communicates with the analog-to-digital converter 62, which associates a binary word with the potential at the output 58 of the analog multiplexing circuit 56. The binary word represents the voltage level of the voltage source 52 that is in communication with the enabled input 54 of the analog multiplexing circuit 56.

One or more outputs 64 of the analog-to-digital converter 62 present the binary word to the interface circuit 68. As is known to one of ordinary skill in the art, the one or more outputs 64 of the analog-to-digital converter 62 may be a parallel output that presents each bit of the binary word on a separate electrical line. The interface circuit 68 outputs a digital representation of the voltage level of the selected voltage source 52 from the integrated circuit to test equipment (not shown). In a preferred embodiment, the interface circuit 68 is a serial interface circuit that outputs the binary word from the analog-to-digital converter 62 bit-by-bit. A serial digital representation of the voltage level may be output on fewer pins of the integrated circuit as compared to the number of pins required to output a parallel digital representation of the voltage level.

Figure 4:
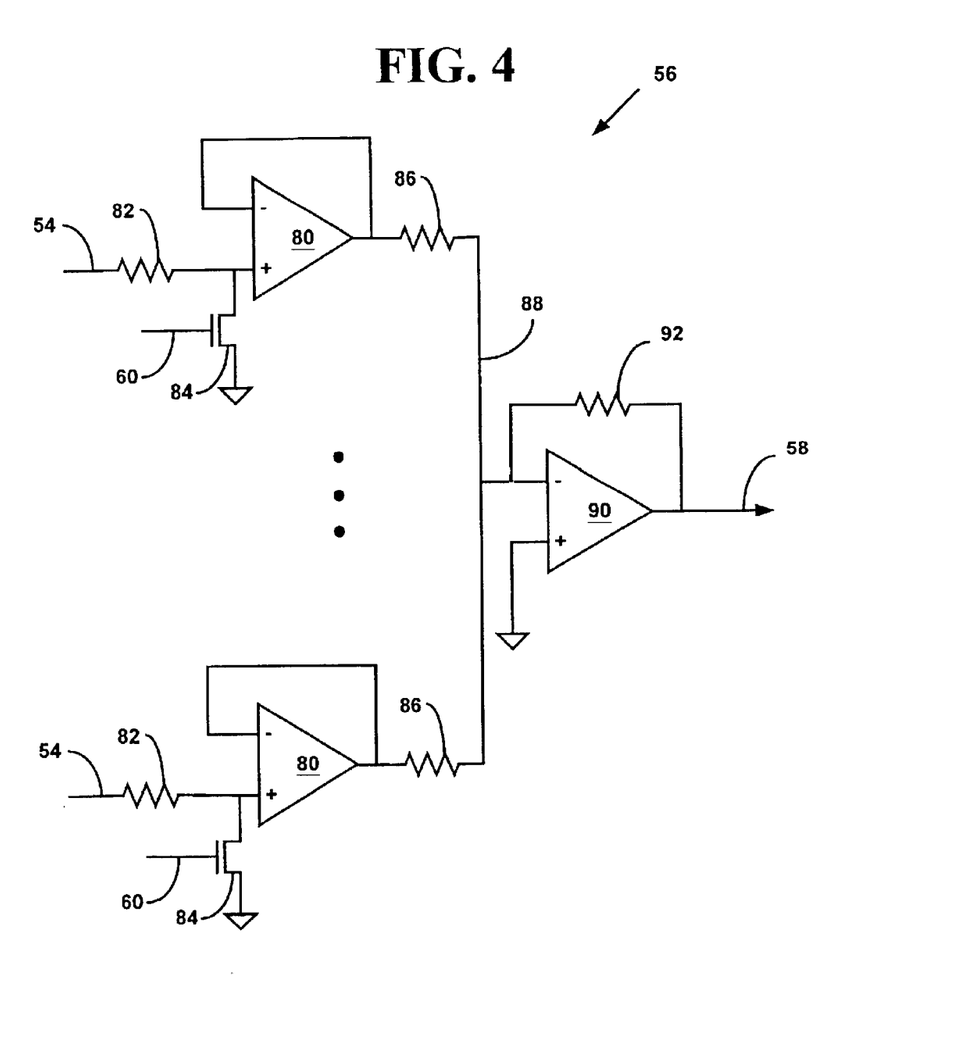
FIG. 4 is a diagram illustrating a preferred embodiment of the analog multiplexing circuit shown in FIG. 3.

FIG. 4 is a diagram illustrating a preferred embodiment of the analog multiplexing circuit 56 shown in FIG. 3. The analog multiplexing circuit 56 includes voltage followers 80 and an amplifier circuit 90. In a preferred embodiment, the voltage followers 80 and amplifier circuit 90 are complementary metal oxide semiconductor ("CMOS") operational amplifiers, familiar to those of ordinary skill in the DRAM art.

The inputs to the analog multiplexing circuit 54 connect to the voltage followers 80 through input resistors 82. The inputs of the voltage followers 80 also connect to transistors 84. When a transistor 84 is not conducting, the voltage level at the input to the corresponding voltage follower 80 is approximately the voltage at the input to the analog multiplexing circuit 56. When the transistor 84 is conducting, the transistor 84 drops the input of the voltage follower 80 to approximately ground potential provided the resistor 82 value is much greater than the drain-to-source resistance of the conducting transistor 84. In the latter state, i.e., when the transistor 84 is conducting, the corresponding resistor 82 is a load for the corresponding voltage source 52, the conducting transistor 84 provides a path between the non-inverting input of the voltage follower 80 and ground, and the potential at the output of the voltage follower 80 is approximately zero.

The gates of the transistors 84 connect to the control lines 60. When the control lines that are connected to the gates of each transistor 84 are at a high potential, such as Vcc, the transistors 84 conduct and drop the input of each voltage follower 80 to ground. When, however, one of the control lines 60 is at ground potential, the input of the voltage follower 80 corresponding to the grounded control line 60 is at approximately the voltage level of the corresponding voltage source 52. In this manner, the voltage levels at the outputs of the voltage, followers 80 are all approximately at ground potential, except for the output of the voltage follower 80 associated with the grounded control line 60, the latter output being approximately the voltage level of the corresponding voltage source 52.

In a preferred embodiment, the control lines 60 connect to a selection circuit 72 as shown in FIG. 3. In operation, the selection circuit 72 drops one of the control lines 60 to ground potential and maintains the other control lines 60 at the high potential. In this manner, the selection circuit 72 controls which voltage source 54 is monitored by the analog multiplexing circuit 56 by enabling the input 54 corresponding to the grounded control line 60. In one preferred embodiment, the selection circuit 72 is integrally formed on the integrated circuit and sequentially grounds each control line 60. For example, the selection circuit 72 may include a k-bit binary counter that counts from a low binary number, such as zero, to a high binary number, such as a $2^k$. The selection circuit 72 resolves the k-bit number into $2^k$ or less individual control lines 60 by methods known to those of ordinary skill in the art. The selection circuit 72 may strobe through the control lines 60 in response to a clock signal from outside the integrated circuit, or alternatively in response to an internal clock signal during a test mode for the integrated circuit.

Returning to FIG. 4, the amplifier circuit 90 receives the voltage level of the selected voltage source 52 from the enabled voltage follower 80 through a resistor 86 and an input line 88 common to each voltage follower 80. The amplifier circuit 90 preferably includes a feedback resistor 92 for setting the gain of the amplifier circuit 90 in combination with the input resistors 86. The gain of the amplifier circuit 90 limits the output range of the analog multiplexing circuit 56 to match the input range of the analog-to-digital converter 62 and to provide a faithful representation of the voltage levels of the voltage sources 52.

The analog-to-digital converter 62 converts the voltage level of the selected voltage source 52 to a binary word. In a preferred embodiment, the binary word includes a sign bit to accommodate the presence of voltage sources 52 on the integrated circuit that generate a voltage level lower than ground level. As is known to those of ordinary skill in the art, some internal DRAM voltages are negative to discharge wordlines 18 or bitlines 16 efficiently.

In another preferred embodiment, the interface circuit 68 includes a buffer circuit (not shown) and a shift register (not shown) for presenting the binary word from the analog-to-digital converter 62 as a series of consecutive bits at the output 70 to the chip. As is known to those of ordinary skill in the art, a serial output 70 may comprise one or more electrical connections, but fewer electrical connections compared to a parallel output. In this manner, the integrated circuit may output the digital representation of the voltage level of the selected voltage source 52 on as few pins of the integrated circuit as required. Using as few pins as required typically does not require a larger footprint of the integrated circuit packaging on a circuit board as previously unused pins on the packaging may be used for the serial output 70.

Figure 5:
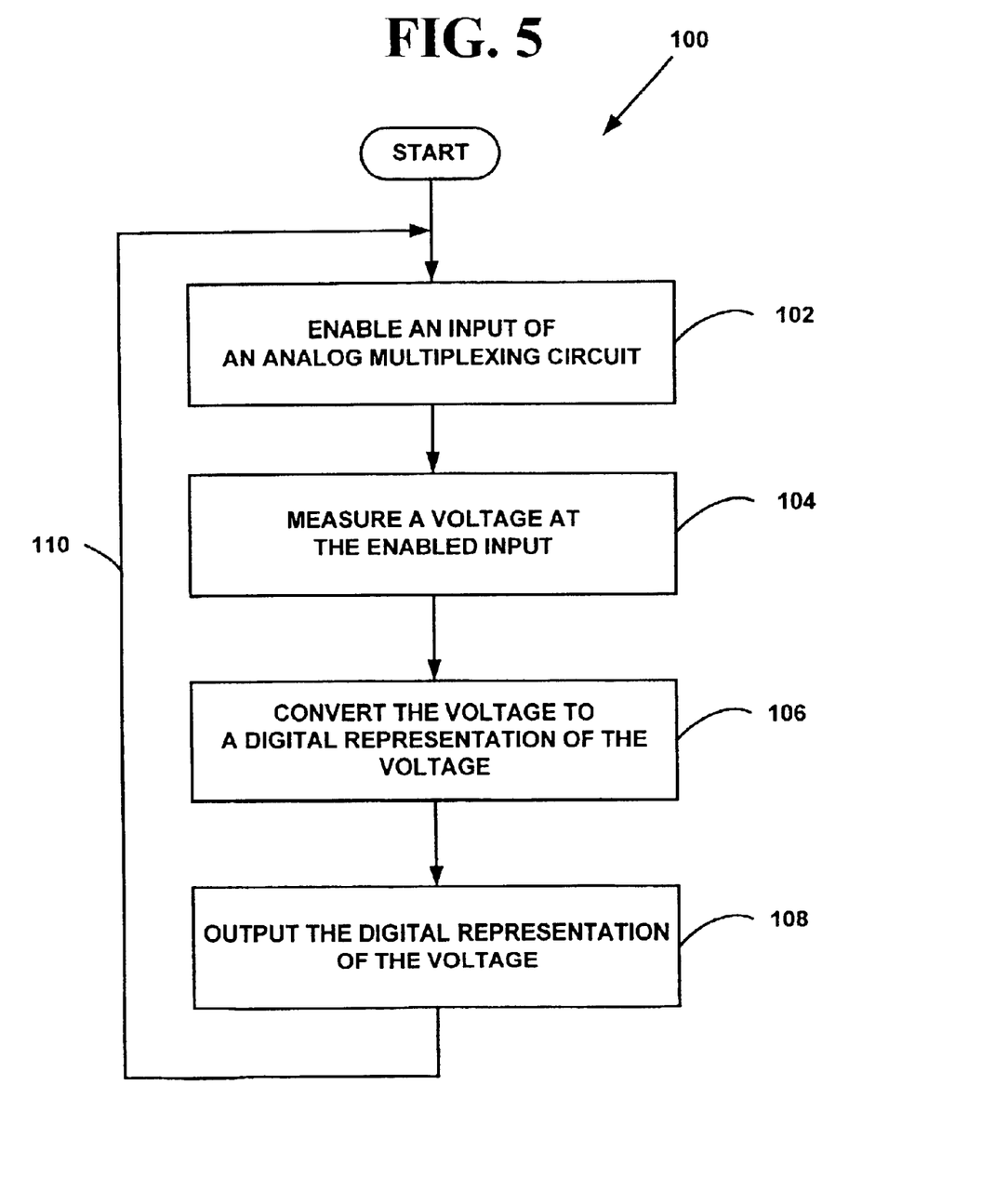
FIG. 5 is a flow diagram illustrating a preferred method for monitoring voltage levels of internal voltage sources in the system of FIG. 3.

FIG. 5 is a flow diagram illustrating a preferred method 100 for monitoring voltage levels of internal voltage sources 52 in the system 50 of FIG. 3. The method 100 includes enabling an input 54 of the analog multiplexing circuit 56 on the integrated circuit at step 102. Each input 54 of the analog multiplexing circuit 56 communicates with a respective voltage source 52. At step 104, the integrated circuit measures a voltage at the enabled input 54 of the analog multiplexing circuit 56. The integrated circuit converts the voltage to a digital representation of the voltage at step 106. At step 108, the integrated circuit outputs the digital representation of the voltage. The integrated circuit repeats 110 the steps 102–108 of the method 100 for each internal voltage source 52. In this manner, the voltage level of each internal voltage source 52 sequentially communicates its voltage level to the analog-to-digital converter 62 through the analog multiplexing circuit 56. In turn, each voltage level is converted to a corresponding digital representation of the voltage, and output from the integrated circuit through the interface circuit 68.

The foregoing detailed description is merely illustrative of several physical embodiments of the invention. Physical variations of the invention, not fully described in the specification, may be encompassed within the purview of the claims. In addition, the steps of the flow diagrams may be taken in sequences other than those described, and more or fewer elements or components may be used in the block diagrams. Also, connections between elements, components, or steps may include intervening elements, components, or steps and are not intended to represent direct connections exclusively. Accordingly, any narrower description of the elements in the specification should be used for general guidance, rather than to unduly restrict any broader descriptions of the elements in the following claims.

We claim:

1. A system for monitoring voltage levels of a plurality of internal voltage sources on an integrated circuit comprising:

an analog multiplexing circuit integrally formed on the integrated circuit having a plurality of inputs and an output, wherein each input of the plurality of inputs of the analog multiplexing circuit is in communication with a respective voltage source of the plurality of internal voltage sources through a respective input resistor of a plurality of input resistors, and wherein the analog multiplexing circuit has a plurality of control lines for enabling a respective input of the plurality of inputs of the analog multiplexing circuit;

an analog-to-digital converter integrally formed on the integrated circuit having an input and at least one output, wherein the input of the analog-to-digital converter is in communication with the output of the analog multiplexing circuit; and an interface circuit integrally formed on the integrated circuit having at least one input and at least one output, wherein the at least one input of the interface circuit is in communication with the at least one output of the analog-to-digital converter, and wherein the at least one output of the interface circuit provides a digital representation of the voltage levels; and wherein the analog multiplexing circuit has a plurality of voltage followers, wherein each voltage follower of the plurality of voltage followers has an output and an input, and wherein each input of the plurality of inputs of the analog multiplexing circuit comprises the input of a respective voltage follower, and wherein each input of the plurality of inputs of the analog multiplexing circuit further comprises a transistor having a gate, wherein the transistor communicates a voltage at the input of the analog multiplexing circuit to the input of the respective voltage follower in response to a signal on the gate, and wherein the gate is in communication with a respective control line of the plurality of control lines, such that when the transistor is conducting, the corresponding input resistor is a load for the corresponding voltage source, the conducting transistor provides a path between the input of the voltage follower and ground, and the potential at the output of the voltage follower is approximately zero.

2. The system of claim 1, wherein the analog multiplexing circuit comprises:

an amplifier circuit having an input and an output, wherein the input of the amplifier circuit communicates with the output of each voltage follower, and wherein the output of the analog multiplexing circuit comprises the output of the amplifier circuit.

3. The system of claim 2, wherein the plurality of voltage followers comprises a plurality of operational amplifiers.

4. The system of claim 2, wherein the amplifier circuit comprises an operational amplifier.

5. The system of claim 1, wherein the interface circuit provides the digital representation of the voltage levels serially on the at least one output of the interface circuit.

6. The system of claim 1, wherein the integrated circuit is a DRAM integrated circuit.

7. The system of claim 6, wherein the plurality of internal voltage sources is a plurality of voltage generators on the DRAM integrated circuit.

8. The system of claim 1 further comprising:
a selection circuit in communication with the plurality of control lines, wherein the selection circuit sequentially activates the plurality of control lines to correspondingly sequentially enable the plurality of inputs of the analog multiplexing circuit.

9. A method for monitoring voltage levels of a plurality of internal voltage sources on an integrated circuit, the method comprising:
(a) enabling an input of an analog multiplexing circuit integrally formed on the integrated circuit, wherein each input of the plurality of inputs of the analog multiplexing circuit is in communication with a respective voltage source of the plurality of internal voltage sources through a respective input resistor of a plurality of input resistors;
(b) measuring a voltage at the enabled input of the analog multiplexing circuit;
(c) converting the voltage to a digital representation of the voltage on the integrated circuit; and
(d) outputting the digital representation of the voltage from the integrated circuit,
wherein the analog multiplexing circuit has a plurality of voltage followers wherein each voltage follower of the plurality of voltage followers has an output and an input, and wherein each input of the plurality of inputs of the analog multiplexing circuit comprises the input of a respective voltage follower, and
wherein each input of the plurality of inputs of the analog multiplexing circuit further comprises a transistor having a gate, wherein the transistor communicates a voltage at the input of the analog multiplexing circuit to the input of the respective voltage follower in response to a signal on the gate, and wherein the gate is in communication with a respective control line of the plurality of control lines, such that
when the transistor is conducting, the corresponding input resistor is a load for the corresponding voltage source, the conducting transistor provides a path between the input of the voltage follower and ground, and the potential at the output of the voltage follower is approximately zero.

10. The method of claim 9 further comprising:
repeating (a), (b), (c), and (d) for each input of the plurality of inputs.

11. The method of claim 9, wherein (a) comprises:
activating a control line associated with the input of the analog multiplexing circuit.

12. A system for monitoring voltage levels of a plurality of internal voltage sources on an integrated circuit comprising:
means for enabling an input of an analog multiplexing circuit integrally formed on the integrated circuit, wherein each input of the plurality of inputs of the analog multiplexing circuit is in communication with a respective voltage source of the plurality of internal voltage sources through a respective input resistor of a plurality of input resistors;

means for measuring a voltage at the enabled input of the analog multiplexing circuit;
means for converting the voltage to a digital representation of the voltage on the integrated circuit; and
means for outputting the digital representation of the voltage from the integrated circuit;
wherein the analog multiplexing circuit has a plurality of voltage followers, wherein each voltage follower of the plurality of voltage followers has an output and an input, and wherein each input of the plurality of inputs of the analog multiplexing circuit comprises the input of a respective voltage follower, and
wherein each input of the plurality of inputs of the analog multiplexing circuit further comprises a transistor having a gate, wherein the transistor communicates a voltage at the input of the analog multiplexing circuit to the input of the respective voltage follower in response to a signal on the gate, and wherein the gate is in communication with a respective control line of the plurality of control lines, such that
when the transistor is conducting, the corresponding input resistor is a load for the corresponding voltage source, the conducting transistor provides a path between the input of the voltage follower and ground, and the potential at the output of the voltage follower is approximately zero.

13. The system of claim 12, further comprising:
means for activating a control line associated with the input of the analog multiplexing circuit.

14. A system for monitoring voltage levels of a plurality of internal voltage sources on an integrated circuit comprising:
a plurality of voltage followers, wherein each voltage follower of the plurality of voltage followers has an output and an input, and wherein each input of the plurality of voltage followers is in communication with a respective internal voltage source of the plurality of internal voltage sources through a respective input resistor of a plurality of input resistors;
a plurality of transistors associated with each input of the plurality of voltage followers, wherein each input transistor has a gate, and wherein the input enabling circuit communicates a voltage from the associated internal voltage source to the input of the associated voltage follower in response to a signal on the gate, and wherein the gate is in communication with a respective control line of a plurality of control lines such that
when the transistor is conducting, the corresponding input resistor is a load for the corresponding voltage source, the conducting transistor provides a path between the input of the voltage follower and ground, and the potential at the output of the voltage follower is approximately zero;
an amplifier circuit having an input and an output, wherein the input of the amplifier circuit is in communication with the output of each voltage follower;
an analog-to-digital converter integrally formed on the integrated circuit having an input and at least one output, wherein the input of the analog-to-digital converter is in communication with the output of the amplifier circuit;
an interface circuit integrally formed on the integrated circuit having at least one input and at least one output, wherein the at least one input of the interface circuit is in communication with the at least one output of the analog-to-digital converter, and wherein the at least one output of the interface circuit provides a digital representation of the voltage levels; and a selection circuit in communication with a respective one of the plurality of control lines, wherein the selection circuit sequentially activates the plurality of control lines to sequentially send the signal to the gate of each input enabling circuit.

15. A method for monitoring voltage levels of a plurality of internal voltage sources on an integrated circuit, the method comprising:

(a) enabling an input of an analog multiplexing circuit integrally formed on the integrated circuit, wherein each input of the plurality of inputs of the analog multiplexing circuit is in communication with a respective voltage source of the plurality of internal voltage sources through a respective input resistor of a plurality of input resistors;

(b) measuring a voltage at the enabled input of the analog multiplexing circuit;

(c) converting the voltage to a digital representation of the voltage on the integrated circuit;

(d) outputting the digital representation of the voltage from the integrated circuit; and repeating (a), (b), (c), and (d) for each input of the plurality of inputs;

wherein the analog multiplexing circuit has a plurality of voltage followers, wherein each voltage follower of the plurality of voltage followers has an output and an input, and wherein each input of the plurality of inputs of the analog multiplexing circuit comprises the input of a respective voltage follower, and wherein each input of the plurality of inputs of the analog multiplexing circuit further comprises a transistor having a gate, wherein the transistor communicates a voltage at the input of the analog multiplexing circuit to the input of the respective voltage follower in response to a signal on the gate, and wherein the gate is in communication with a respective control line of the plurality of control lines, such that when the transistor is conducting, the corresponding input resistor is a load for the corresponding voltage source, the conducting transistor provides a path between the input of the voltage follower and the ground, and the potential at the output of the voltage follower is approximately zero.

* * * * *